United States Patent
Lee et al.

(10) Patent No.: US 10,699,966 B2
(45) Date of Patent: Jun. 30, 2020

(54) SEMICONDUCTOR DEVICE WITH PROFILED WORK-FUNCTION METAL GATE ELECTRODE AND METHOD OF MAKING

(71) Applicant: Taiwan Semiconductor Manufacturing Company Limited, Hsin-Chu (TW)

(72) Inventors: Da-Yuan Lee, Jhubei (TW); Hung-Chin Chung, Pingzhen (TW); Hsien-Ming Lee, Changhua (TW); Kuan-Ting Liu, Hsinchu (TW); Syun-Ming Jang, Hsin-Chu (TW); Weng Chang, Hsin-Chu (TW); Wei-Jen Lo, Hsinchu (TW)

(73) Assignee: Taiwan Semiconductor Manufacturing Company Limited, hsin-chu (TW)

( * ) Notice: Subject to any disclaimer, the term of this patent is extended or adjusted under 35 U.S.C. 154(b) by 301 days.

(21) Appl. No.: 15/450,324

(22) Filed: Mar. 6, 2017

(65) Prior Publication Data

US 2017/0178973 A1  Jun. 22, 2017

Related U.S. Application Data

(62) Division of application No. 14/096,108, filed on Dec. 4, 2013, now Pat. No. 9,590,065.

(51) Int. Cl.
*H01L 21/8238* (2006.01)
*H01L 21/28* (2006.01)
(Continued)

(52) U.S. Cl.
CPC ........... *H01L 21/823842* (2013.01); *H01L 21/28088* (2013.01); *H01L 29/4966* (2013.01);
(Continued)

(58) Field of Classification Search
CPC .......... H01L 29/7833; H01L 21/28088; H01L 29/66606; H01L 29/512; H01L 29/66545;
(Continued)

(56) References Cited

U.S. PATENT DOCUMENTS

| 5,302,846 A | 4/1994 | Matsumoto |
| 8,119,470 B2 | 2/2012 | Ekobte et al. |

(Continued)

FOREIGN PATENT DOCUMENTS

| CN | 1057131 A | 12/1991 |
| CN | 103311247 A | 9/2013 |

(Continued)

OTHER PUBLICATIONS

Corresponding Chinese Patent Application Office Action dated Oct. 10, 2017 (46 pgs).

(Continued)

*Primary Examiner* — Savitri Mulpuri
(74) *Attorney, Agent, or Firm* — Cooper Legal Group, LLC

(57) ABSTRACT

The present disclosure provides a semiconductor device with a profiled work-function metal gate electrode. The semiconductor structure includes a metal gate structure formed in an opening of an insulating layer. The metal gate structure includes a gate dielectric layer, a barrier layer, a work-function metal layer between the gate dielectric layer and the barrier layer and a work-function adjustment layer over the barrier layer, wherein the work-function metal has an ordered grain orientation. The present disclosure also provides a method of making a semiconductor device with a profiled work-function metal gate electrode.

20 Claims, 14 Drawing Sheets

(51) Int. Cl.
  *H01L 29/49* (2006.01)
  *H01L 29/66* (2006.01)
  *H01L 29/51* (2006.01)
  *H01L 29/78* (2006.01)

(52) U.S. Cl.
  CPC .......... *H01L 29/512* (2013.01); *H01L 29/517* (2013.01); *H01L 29/66545* (2013.01); *H01L 29/66606* (2013.01); *H01L 29/7833* (2013.01)

(58) Field of Classification Search
  CPC ......... H01L 21/823842; H01L 29/4966; H01L 29/517
  See application file for complete search history.

(56) References Cited

U.S. PATENT DOCUMENTS

| | | |
|---|---|---|
| 8,304,842 B2 | 11/2012 | Chew et al. |
| 8,673,758 B2* | 3/2014 | Ma .................. H01L 21/823842 257/369 |
| 8,803,254 B2* | 8/2014 | Laloe .................. H01L 29/4966 257/410 |
| 9,166,020 B2* | 10/2015 | Yang .................. H01L 21/28088 |
| 2010/0124818 A1 | 5/2010 | Lee et al. |
| 2011/0140207 A1 | 6/2011 | Lin et al. |
| 2013/0119487 A1 | 5/2013 | Lin, Jr. et al. |

FOREIGN PATENT DOCUMENTS

| | | |
|---|---|---|
| KR | 10-2012-0007430 | 1/2012 |
| KR | 1020120007430 A | 1/2012 |
| KR | 1020130117620 A | 10/2013 |

OTHER PUBLICATIONS

Corresponding Chinese Patent Application 1st Office Action issued by SIPO dated Mar. 27, 2017 (37 pgs).
Corresponding Korean Application 10-2014-0169496, Korean Office action dated Dec. 26, 2016, 4 pages.
Corresponding Korean Patent Application Notice of Allowance dated Jul. 25, 2017 (4 pgs).

* cited by examiner

SEMICONDUCTOR DEVICE WITH PROFILED WORK-FUNCTION METAL GATE ELECTRODE AND METHOD OF MAKING

RELATED APPLICATION

This application is a divisional of and claims priority to U.S. patent application Ser. No. 14/096,108, having an amended title of "SEMICONDUCTOR DEVICE WITH METAL GATE STRUCTURE COMPRISING WORK-FUNCTION METAL LAYER AND WORK-FUNCTION ADJUSTMENT LAYER" and filed on Dec. 4, 2013, which is incorporated herein by reference.

BACKGROUND

Complementary metal-oxide-semiconductor (CMOS) technology is a semiconductor technology used for the manufacture of integrated circuits (ICs). CMOS transistors typically utilize polysilicon as the gate electrode for both NMOS and PMOS transistors, wherein the polysilicon is doped with an N-type dopant to form NMOS transistors and doped with a P-type dopant to form PMOS transistors.

DETAILED DESCRIPTION

Figure 1:
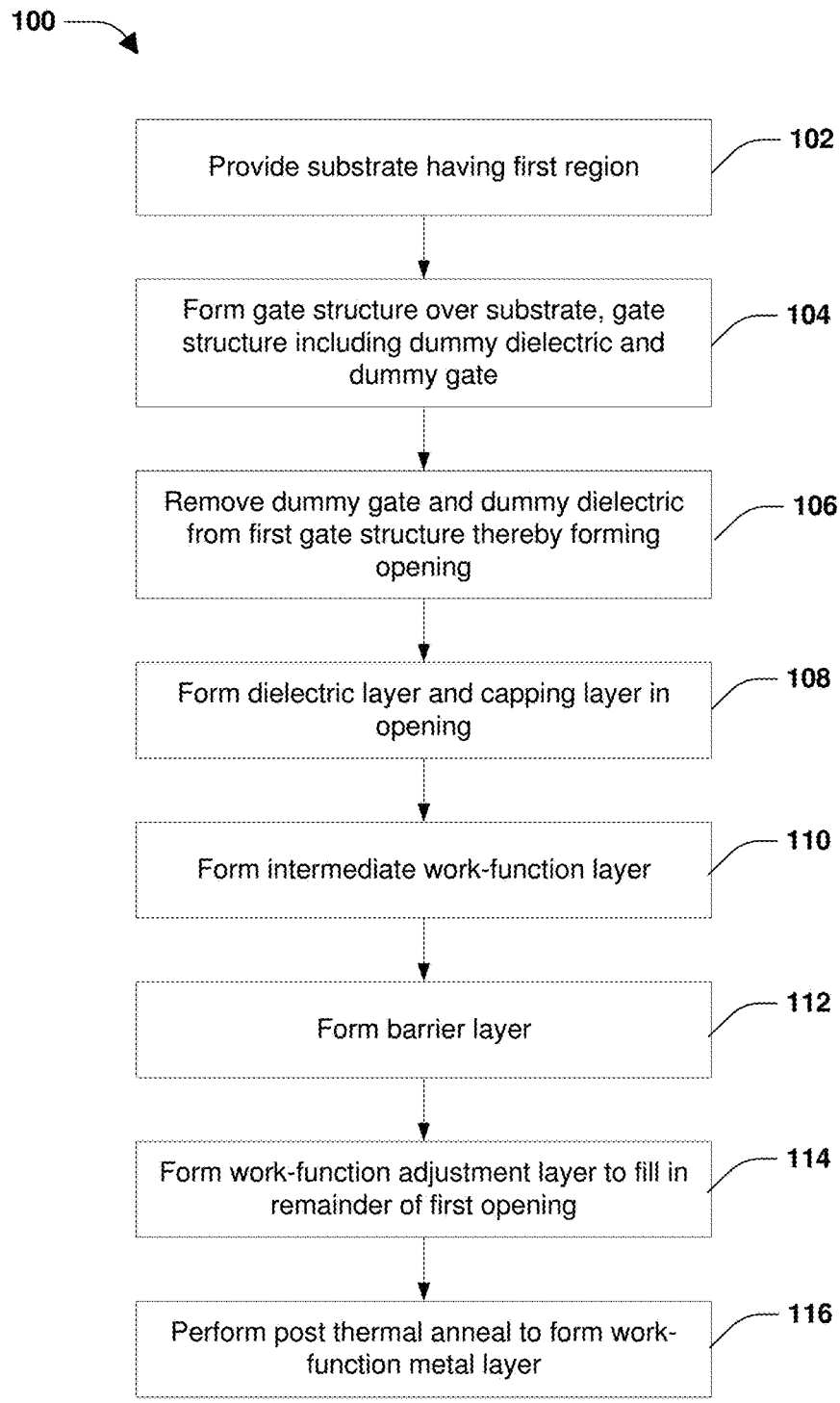
FIG. 1 is a flow diagram illustrating a method for fabricating a semiconductor device with a profiled work-function metal gate electrode, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

According to some embodiments, a semiconductor device having a metal gate electrode, as opposed to a doped polysilicon gate electrode, is provided herein. Some embodiments are illustrated with regard to fabricating a NMOS transistor. However, in some embodiments, a PMOS and a NMOS transistor are fabricated so as to be adjacent to one another, spaced apart or fabricated separately.

Figure 2:
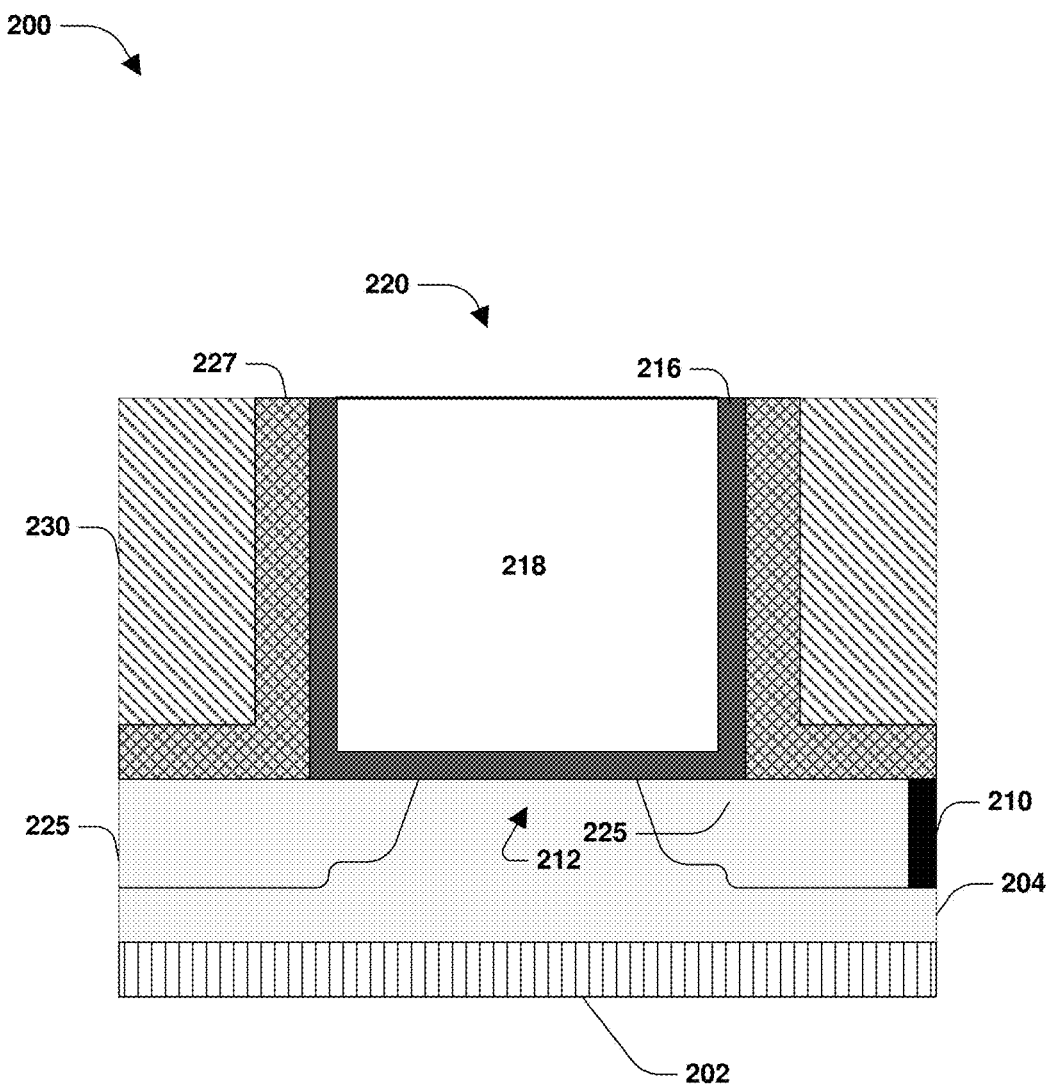
FIGS. 2 to 5 are cross-sectional views of a semiconductor device at various stages of fabrication, according to some embodiments.

Referring to FIG. 1, illustrated is a flow diagram of a method 100 for fabricating a semiconductor device with a profiled work-function metal gate electrode according to some embodiments. Referring also to FIGS. 2 to 5 and 7 to 9, illustrated are cross-sectional views of a semiconductor device 200 at various stages of fabrication according to some embodiments, such as according to the method 100 of FIG. 1. In some embodiments, part of the semiconductor device 200 is fabricated with a CMOS process flow. In some embodiments, additional processes are provided before, during, and after the method 100 of FIG. 1. FIG. 2 illustrates an embodiment wherein the semiconductor device 200 is shown following a chemical mechanical polishing (CMP) on an interlayer dielectric (ILD) that exposes a dummy poly gate.

At 102, a semiconductor substrate 202 is provided. In some embodiments, the substrate includes a wafer, die formed from a wafer, etc. In some embodiments, the semiconductor substrate 202 is a silicon substrate. In some embodiments, the substrate 202 is at least one of silicon germanium, gallium arsenic, or other suitable semiconductor materials. In some embodiments, the substrate 202 includes one or more doped regions, such as at least one of a P-well or N-well. In some embodiments, the substrate 202 includes other features such as a buried layer or an epitaxy layer. In some embodiments, the substrate 202 is a semiconductor on an insulator such as silicon on insulator (SOI). In some embodiments, the semiconductor substrate 202 includes a doped epi layer. In some embodiments, the semiconductor substrate 202 includes a semiconductor layer overlying another semiconductor layer of a different type. In some embodiments, the semiconductor substrate 202 is a silicon layer on a silicon germanium layer.

In some embodiments, the semiconductor device 200 includes an isolation structure 210 such as a shallow trench isolation (STI) feature formed in the substrate 202 for isolating an active region 204 of the substrate. In some embodiments, the isolation structure 210 includes a local oxidation of silicon (LOCOS) configuration. In some embodiments, the isolation structure 210 is formed from at least on of silicon oxide, silicon nitride, silicon oxynitride, fluoride-doped silicate (FSG) or a low k dielectric material. In some embodiments, the active region is configured as at least one of a NMOS device, such as a nFET 212, or a PMOS device (not shown). In some embodiments, the isolation structure 210 isolates the active region of a NMOS device 212 from the active region of an adjacent device, such as a PMOS device.

At 104, a dummy gate structure 220 is formed over the substrate 202, the dummy gate structure includes a dummy dielectric 216 and a dummy poly gate 218. In some embodiments, the formation of the dummy gate structure 220 includes forming various material layers, and etching/patterning the various material layers to form a gate structure of the nFET 212 device.

In some embodiments, the dummy dielectric 216 is formed on the substrate 202. In some embodiments, the dummy dielectric 216 includes an oxide. In some embodiments, the dummy dielectric 216 includes a thickness ranging from about 10 to about 50 angstrom (A). In some embodiments, the dummy poly gate 218 is a polysilicon. In some embodiments, the dummy poly gate 218 is formed over the dummy dielectric 216 by a suitable process, such as deposition. In some embodiments, the dummy poly gate 218 is formed by a chemical vapor deposition (CVD) process utilizing one or more of silane (SiH$_4$), di-silane (Si$_2$H$_6$), or di-clorsilane (SiCl$_2$H$_4$). In some embodiments, the dummy poly gate 218 is about 200 to about 2000 angstroms thick.

In some embodiments, after formation of the dummy gate structure 220, the semiconductor device 200 undergoes additional CMOS processing to form various features of the nFET 212. In some embodiments, semiconductor device 200 includes doped source/drain regions 225, sidewall or gate spacers 227, silicide features, contact etch stop layer (CESL), and an interlayer dielectric (ILD) 230. In some embodiments, the sidewall spacers 227 are formed before the dummy gate structure 220 is removed such that the dummy gate structure 220 serves to define the sidewall spacers 227. Thus, when the dummy gate structure is 220 is removed, the opening 288 is defined between the sidewall spacers 227 and within the ILD 230, where the ILD 230 serves as an insulating layer. In some embodiments, the ILD 230 includes an oxide formed by at least one of a high aspect ratio process (HARP) or high density plasma (HDP) deposition process. In some embodiments, the deposition of the ILD 230 fills in a gap between the semiconductor device 200 and an adjacent semiconductor device. In some embodiments, the adjacent semiconductor device is a pFET. In some embodiments, a chemical mechanical polishing (CMP) process is performed on the ILD 230 to planarize the ILD until the dummy poly gate 218 is exposed.

Figure 3:
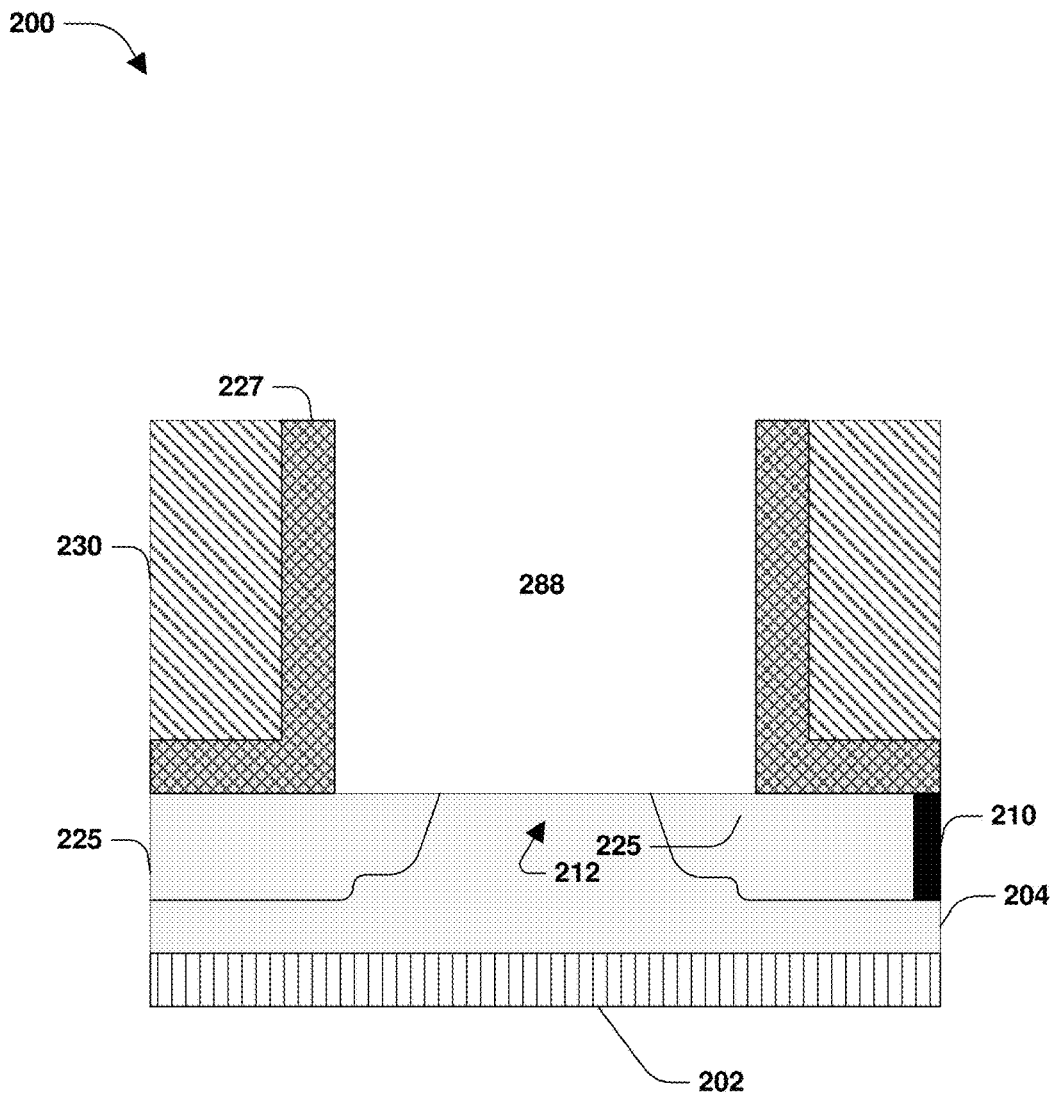

At 106, the dummy dielectric 216 and dummy poly gate 218 are removed thereby forming an opening 288 in the ILD 230 as illustrated in FIG. 3. In some embodiments, the dummy poly gate 218 and dummy dielectric 216 are removed by a dry etch, wet etch, combination dry and wet etch, or other suitable process. In some embodiments, the dummy poly gate 218 and dummy dielectric 216 are removed in a single etching process. In some embodiments, a first wet etch process is used to remove the dummy poly gate 218 and a second wet etch process is used to remove the dummy dielectric 216. In some embodiments, the second wet etch process is selective so as to remove the dummy dielectric 216 while stopping on the substrate 202, thereby forming the opening 288.

Figure 4:
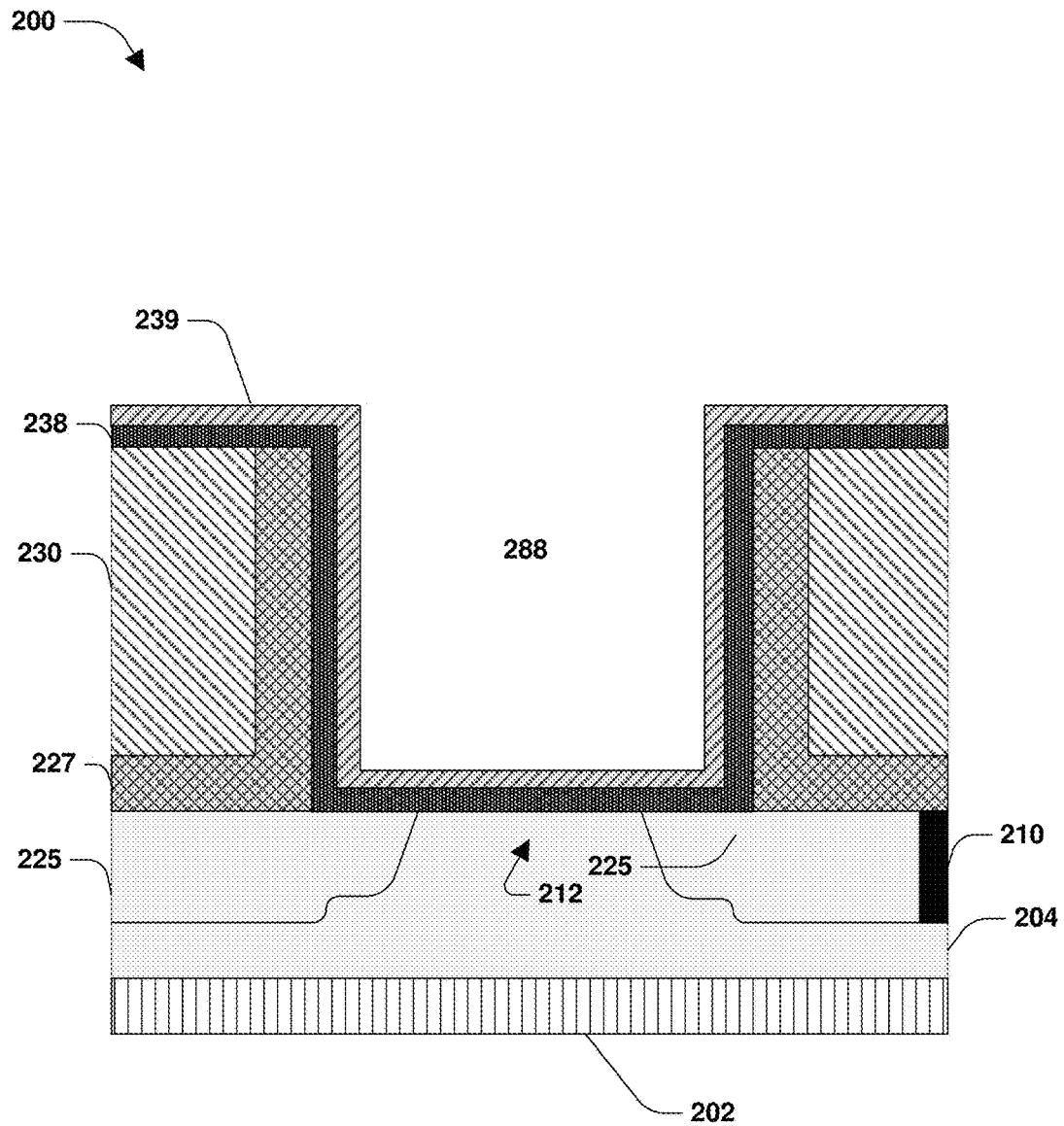

At 108, a gate dielectric layer 238 and capping layer 239 are formed to at least partially fill the opening 288, as illustrated in FIG. 4. In some embodiments, the gate dielectric layer 238 is formed on the side wall spacers 227 as well as over the active region 204 of the substrate 202. In some embodiments, the gate dielectric layer is a high-k dielectric layer. In some embodiments, the gate dielectric layer 238 is formed by at least one of ALD, CVD, metalorganic CVD (MOCVD), PVD, plasma enhanced CVD (PECVD), plasma enhance ALD (PEALD) or other suitable techniques. In some embodiments, the gate dielectric layer 238 is about 5 to about 20 angstroms thick. In some embodiments, the gate dielectric layer 238 includes a binary or ternary high-k film. In some embodiments, the gate dielectric layer 238 is HfOx. In some embodiments, the gate dielectric layer 238 is at least one of LaO, AlO, ZrO, TiO, Ta$_2$O$_5$, Y$_2$O$_3$, SrTiO$_3$(STO), BaTiO$_3$(BTO), BaZrO, HfZrO, HfLaO, HfSiO, LaSiO, AlSiO, HfTaO, HfTiO, (Ba,Sr)TiO$_3$(BST), Al$_2$O$_3$, Si$_3$N$_4$ or oxynitrides. In some embodiments, a post high-k deposition anneal is performed as part of forming the dielectric layer 238.

In some embodiments, the capping layer 239 is formed over the gate dielectric layer 238. In some embodiments, the capping layer 239 includes titanium nitride (TiN) or tantalum nitride (TaN). In some embodiments, the capping layer 239 is about 5 to about 50 angstroms thick. In some embodiments, the capping layer 239 includes Si$_3$N$_4$. In some embodiments, the capping layer 239 functions as a barrier to protect the gate dielectric layer 238. In some embodiments, the capping layer 239 is formed by deposition techniques such as at least one of ALD, PVD or CVD. In some embodiments, the capping layer 239 is optional and thus is not formed.

In some embodiments, an interfacial layer (not shown) is present between the sidewall spacers 227 and the gate dielectric layer 238. In some embodiments, the interfacial layer includes a silicon oxide (SiO$_2$) layer having a thickness ranging from about 5 to about 20 angstroms. In some embodiments, the interfacial layer includes at least one of HfSiO or SiON formed by at least one of atomic layer deposition (ALD), CVD, PVD, thermal oxidation and nitridation, plasma oxidation or nitridation. In some embodiments, to form the interfacial layer, an Hf film is formed on a thermal oxide by ALD, CVD, or PVD, and then oxidized by thermal O$_2$ to form HfSiO. In some embodiments, an Hf film is formed by ALD, CVD, or PVD in a reactive O$_2$ and H$_2$O ambient.

Figure 5:
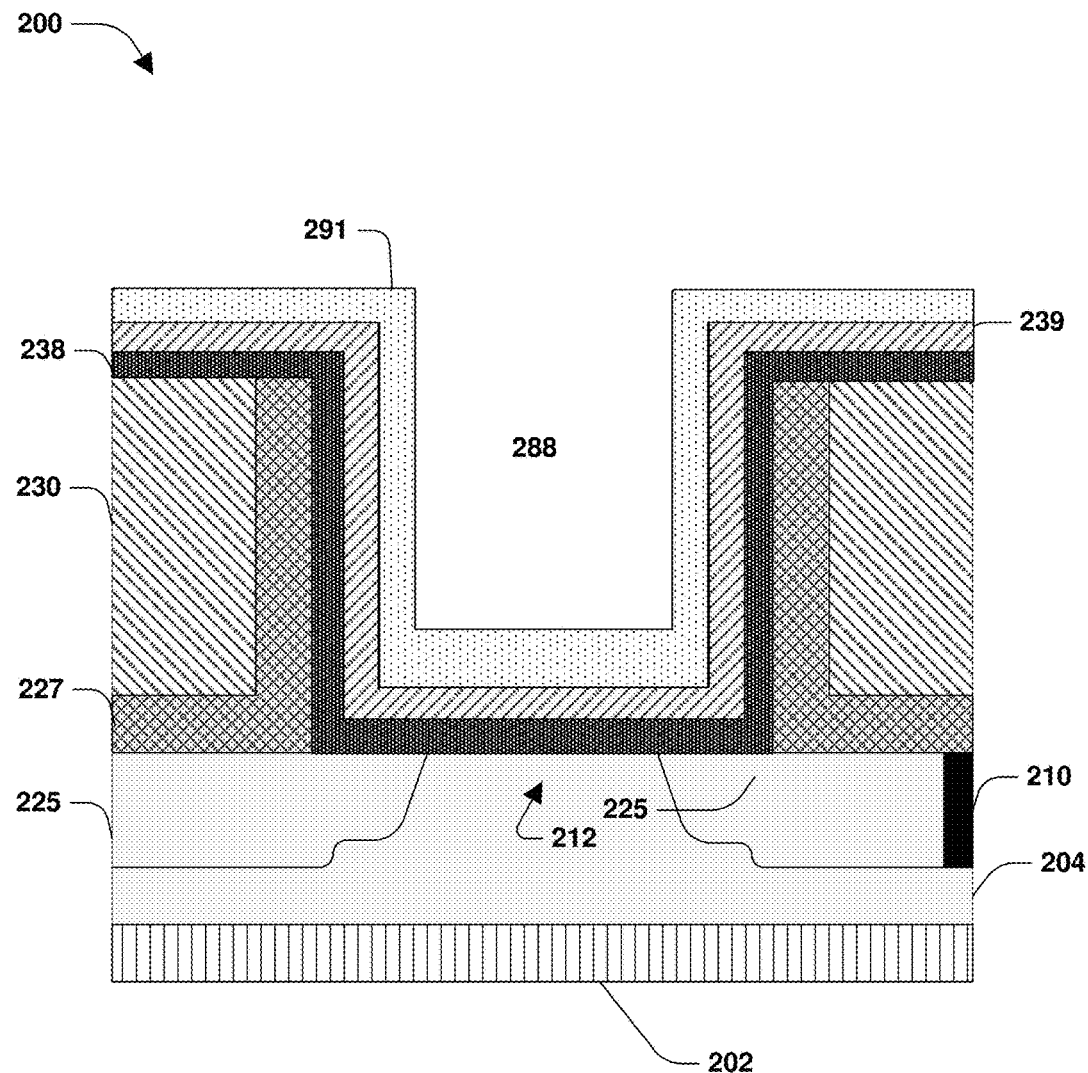

At 110, an intermediate work-function metal layer 291 is formed on the capping layer 239, as illustrated in FIG. 5. In some embodiments, the capping layer 239 is optional and thus the intermediate work-function metal layer 291 is formed on the gate dielectric layer 238. In some embodiments, the intermediate work-function metal layer 291 is an N-type or P-type work-function metal. In some embodiments, the intermediate work-function metal layer 291 is titanium aluminide (TiAl). In some embodiments, the intermediate work-function metal layer 291 is TiAl$_3$. In some embodiments, the intermediate work-function metal layer 291 is at least one of nickel aluminide (NiAl) or iron aluminide (FeAl).

Figure 6:
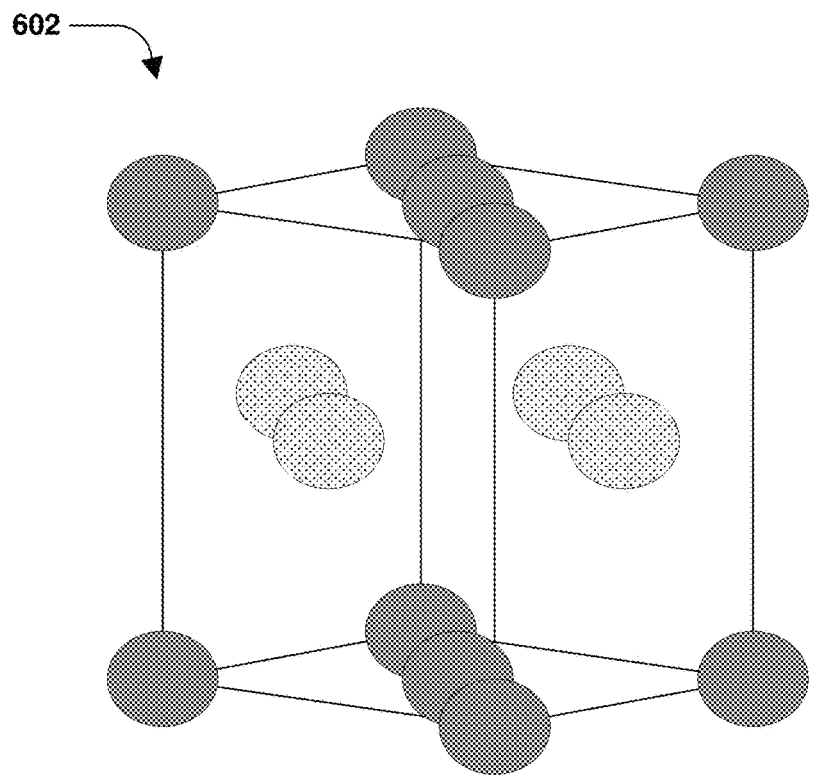
FIG. 6 is an illustration of a crystal structure of an intermediate work-function metal, according to some embodiments.
Figure 6:
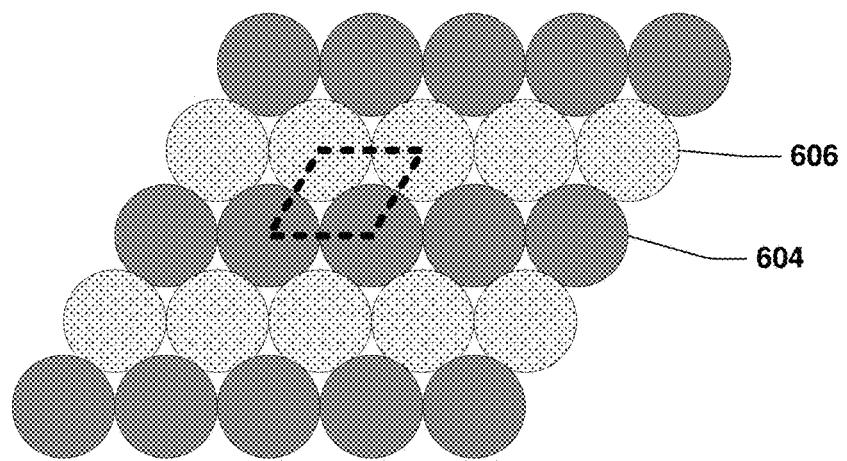

In some embodiments, the intermediate work-function metal layer 291 is formed by deposition techniques such as at least one of ALD, CVD or PVD at a temperature above about 200° C. In some embodiments, the intermediate work-function metal layer 291 is deposited at a temperature between about 250 to about 500° C. In some embodiments, the intermediate work-function metal layer 291 is deposited at a temperature between about 300 to 400° C. In some embodiments, the metal grain orientation of the intermediate work-function metal layer 291 is rallied during depositions above 200° C. In some embodiments, the intermediate work-function metal layer 291 is amorphous before deposition and crystalline after deposition. In some embodiments, the intermediate work-function metal layer 291 is a crystallized metal. In some embodiments, the intermediate work-function metal layer 291 has a crystalline XRD profile. In some embodiments, the intermediate work-function metal is crystalline TiAl and is characterized by a XRD pattern with a peak between about 38.0 to about 40.0 degrees 2 theta. In some embodiments, the intermediate work-function metal has a (111) oriented plane, as illustrated in FIG. 6. In some embodiments, the (111) oriented plane of the intermediate work-function metal is stoichiometric and alternates close-packed rows of Ti 604 and Al 606, as illustrated in FIG. 6. In some embodiments, the intermediate work-function metal layer contains a metal that has a FCC crystal structure 602, as illustrated in FIG. 6.

In some embodiments, the intermediate work-function metal layer 291 is at least 10 angstroms thick. In some embodiments, the intermediate work-function metal layer 291 is between about 20 to about 100 angstroms thick. In some embodiments, the intermediate work-function metal layer 291 is thicker at the bottom of the opening 288 adjacent the substrate 202 than along the sides of the opening 288 adjacent to the sidewall spacers 227. In some embodiments, the intermediate work-function metal layer 291 is about 5 to about 40 angstroms thick along the sides of the opening 288 adjacent the sidewall spacers 227 and about 20 to about 80 angstroms thick at the bottom of the opening 288 adjacent the substrate 202. In some embodiments, the intermediate work-function metal layer 291 is at least 1.5 times thicker at the bottom of the opening 288 than at the sides of the opening 288.

Figure 7:
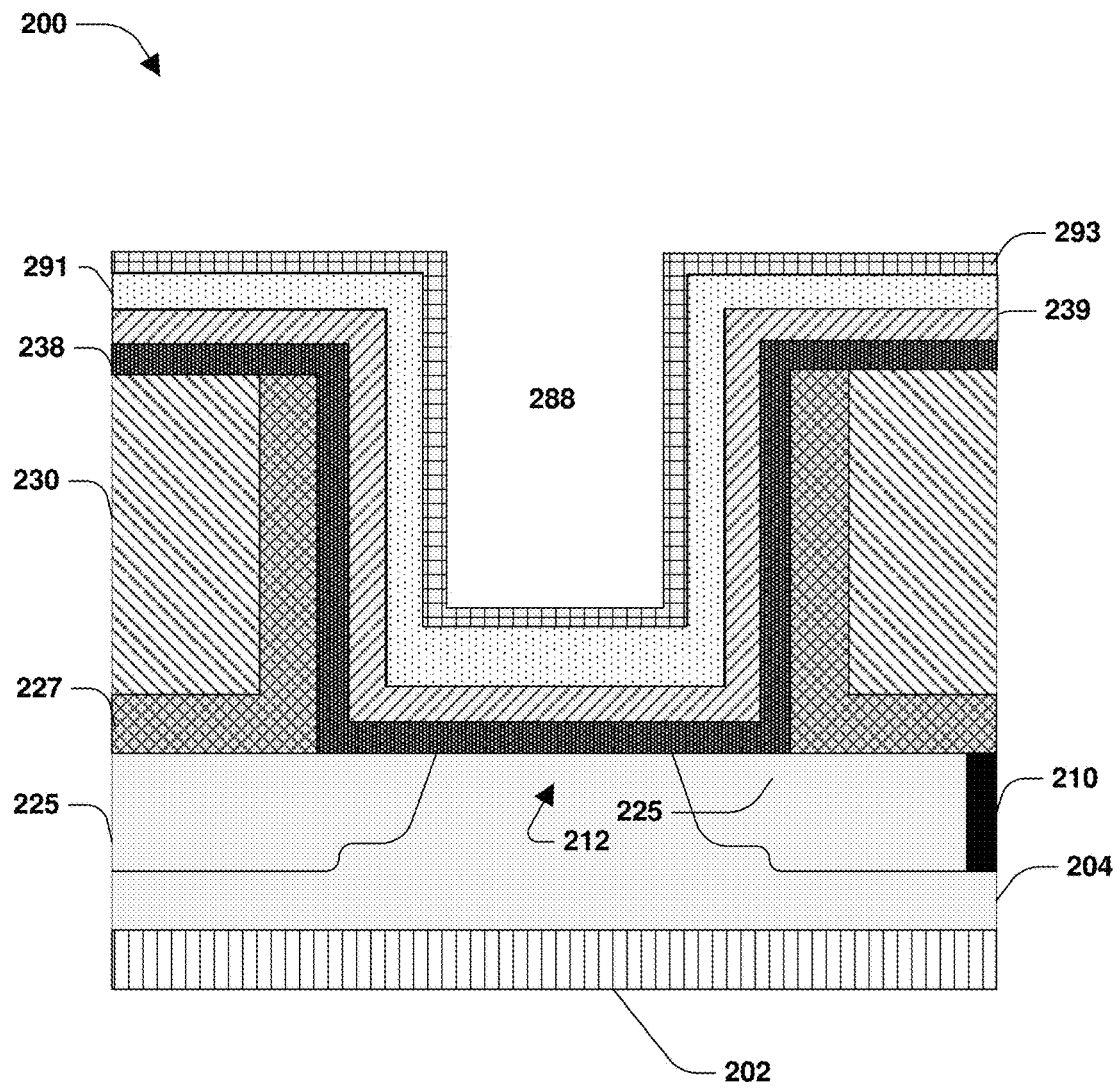
FIGS. 7, 8a, 8b and 9 are cross-sectional views of a semiconductor device at various stages of fabrication, according to some embodiments.

At 112, a barrier layer 293 is formed over the intermediate work-function metal layer 291, as illustrated in FIG. 7. In some embodiments, the barrier layer 293 is titanium nitride/tungsten nitride (TiN/WN). In some embodiments, the barrier layer 293 is at least one of tungsten nitride (WN), tantalum nitride (TaN) or ruthenium (Ru). In some embodiments, the barrier layer 293 is a multi-metal layer structure. In some embodiments, the barrier layer 293 is between about 20 to about 100 angstroms thick. In some embodiments, the barrier layer 293 is thinner at the sidewalls than at the bottom of the opening 288. In some embodiments, the barrier layer 293 is formed by deposition techniques such as at least one of ALD, CVD or PVD.

Figure 8A:
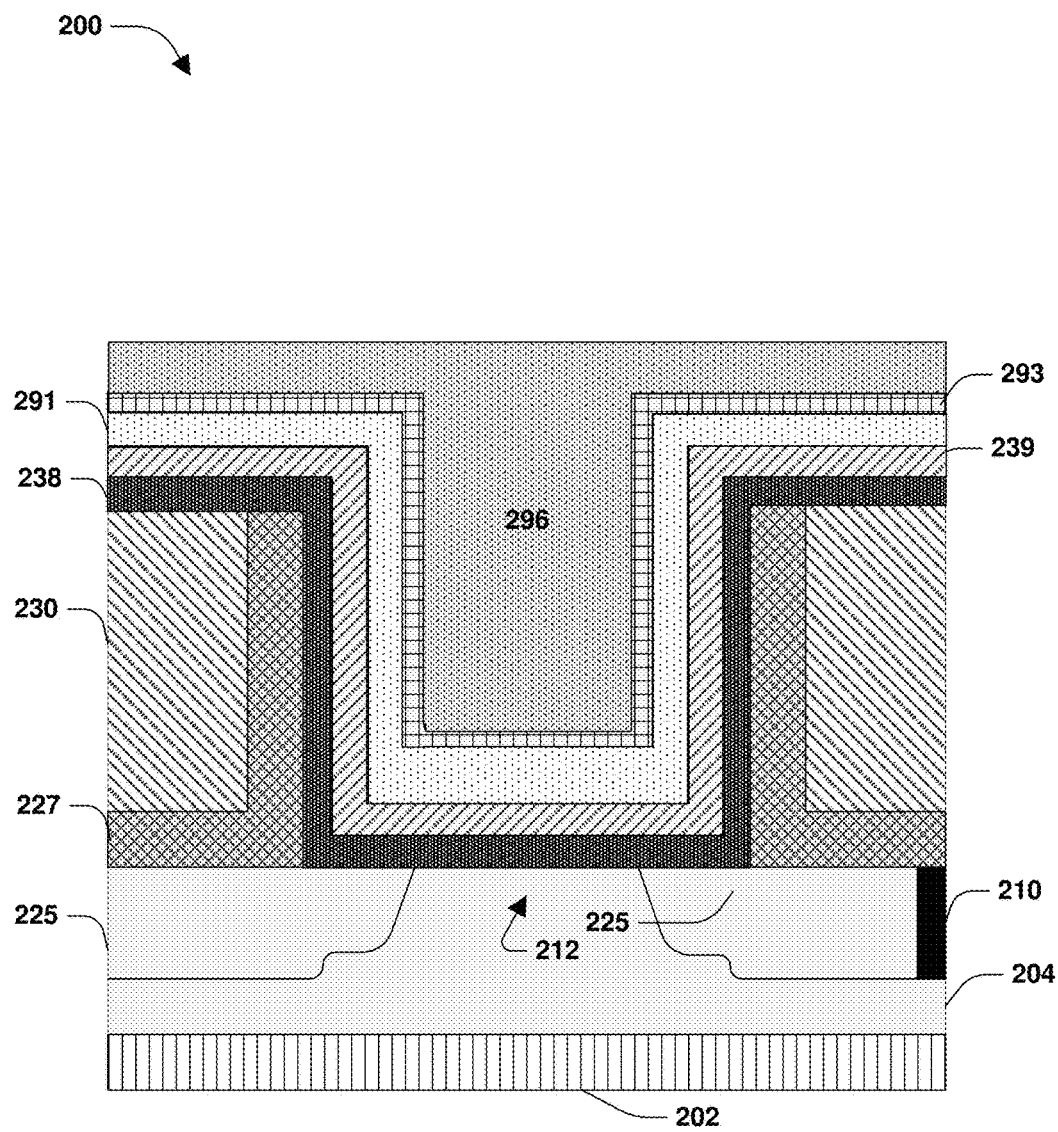
Figure 8B:
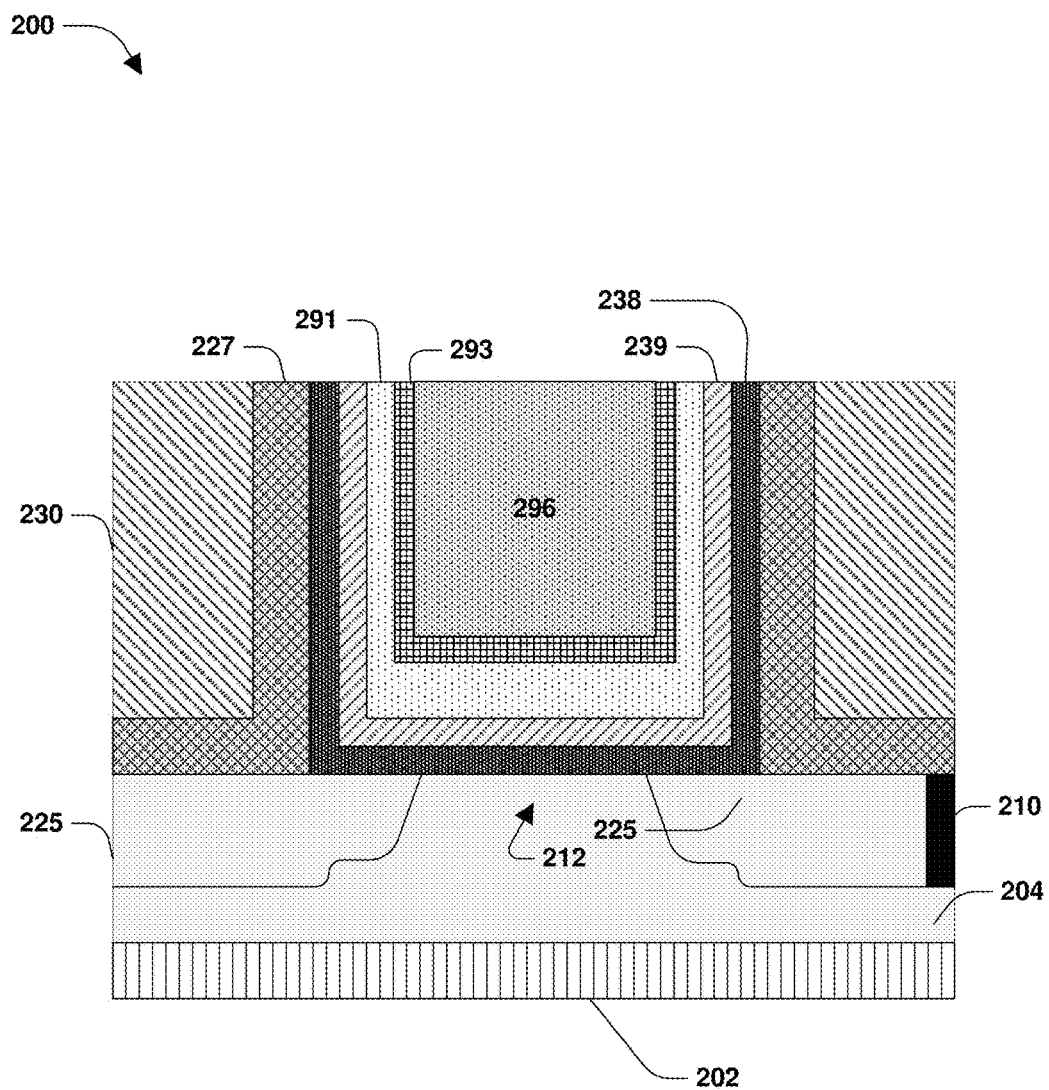

At 114, a work-function adjustment layer 296 is formed to fill in the remainder of the opening 288, as illustrated in FIG. 8a. In some embodiments, the work-function adjustment layer 296 is a metal. In some embodiments, the work-function adjustment layer 296 is Al. In some embodiments, the work-function adjustment layer 296 is deposited by forming a first Al layer by CVD and then forming a second Al layer by PVD. In some embodiments, the work-function adjustment layer 296 includes at least one of Al, tungsten (W), copper (Cu), or other suitable metal material. In some embodiments, a CMP is performed on the semiconductor device 200 to remove excess material outside of the opening 288, as illustrated in FIG. 8b.

Figure 9:
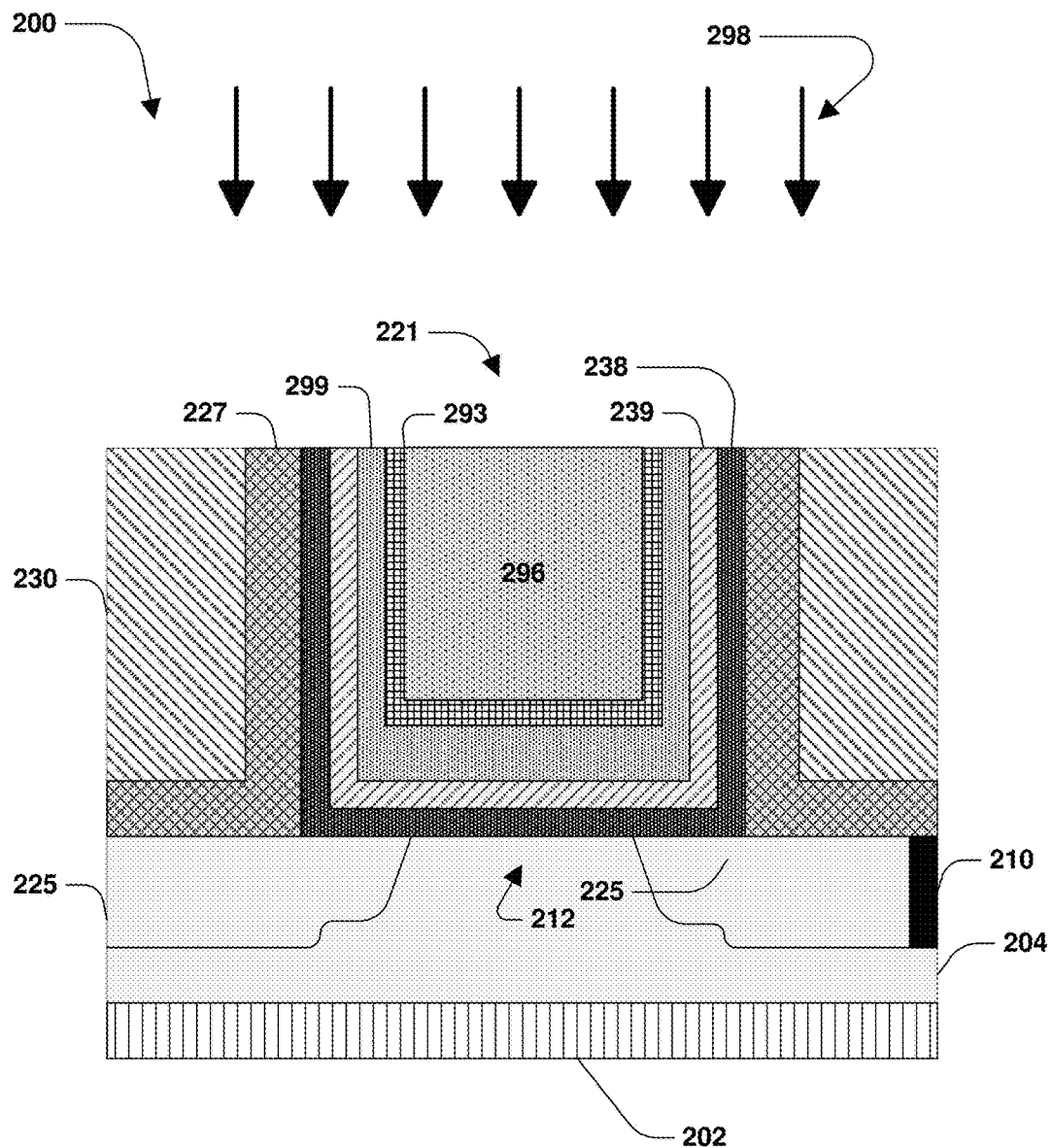

At 116, a post thermal anneal 298 is carried out to form a work-function metal layer 299 as illustrated in FIG. 9. In some embodiments, the post thermal anneal 298 is carried out after back end of line (BEOL) processes have been preformed. Although not illustrated, such BEOL processes form, inter alia, at least one of conductive contacts or dielectric layers over the semiconductor device 200. The work-function metal layer 299 is formed by the post thermal anneal 298 driving the work-function adjustment layer 296 through the barrier layer 293 to interact with the intermediate work-function metal layer 291. In some embodiments, the post thermal anneal 298 is preformed at a temperature above about 200° C. In some embodiments, the post thermal anneal 298 is preformed at a temperature ranging from about 300 to about 600° C. In some embodiments, the post thermal anneal 298 is preformed for about 1 minute. According to some embodiments, the semiconductor device 200 thus has a metal gate structure 221 formed in the opening 288 in the ILD 230 or insulating layer, where the metal gate structure includes the gate dielectric layer 238, the barrier layer 293, work-function metal layer 299, and the work-function adjustment layer 296.

Figure 10:
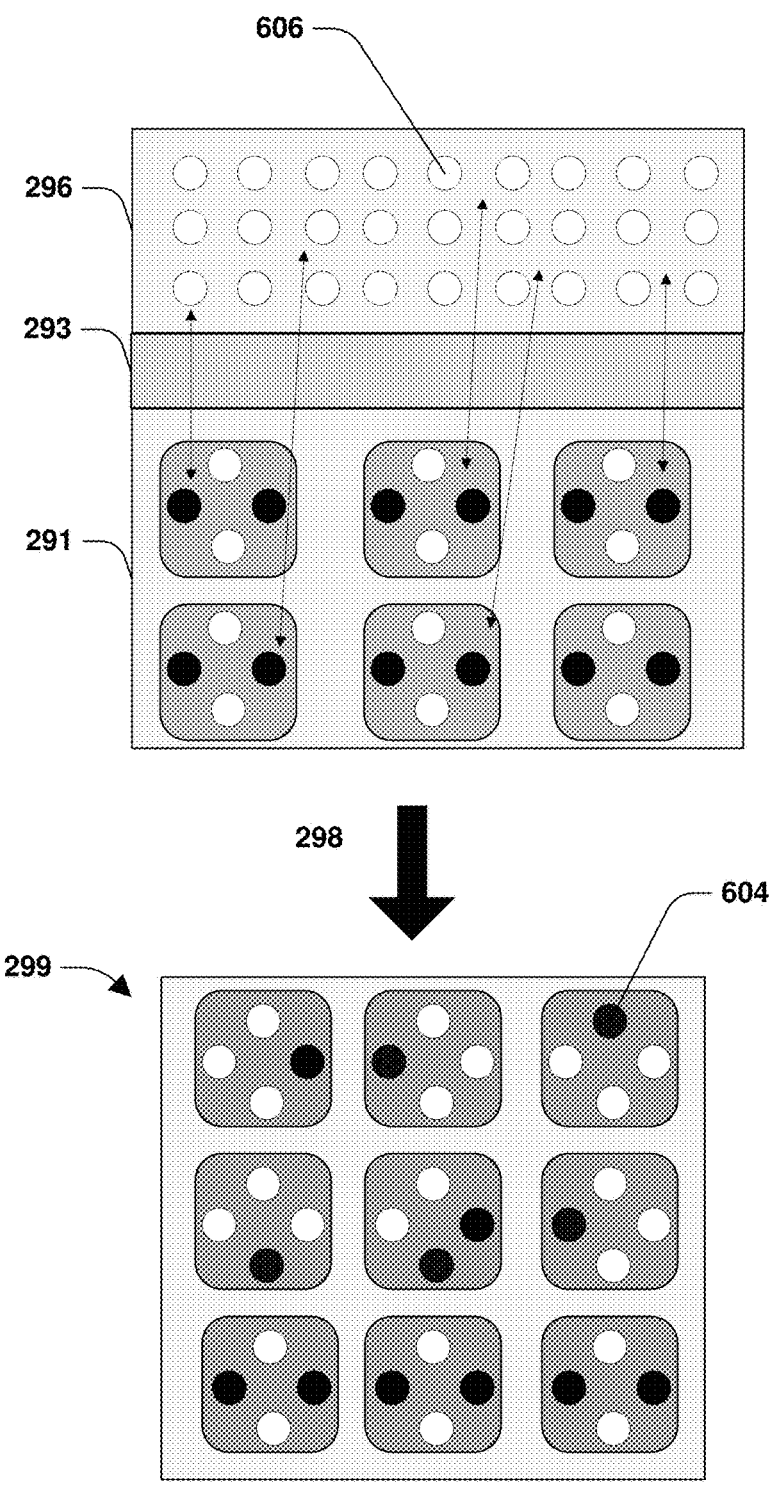
FIG. 10 is an illustration of forming a work-function metal layer, according to some embodiments.

FIG. 10 provides an illustration of an embodiment of the post thermal anneal 298 driving the work-function adjustment layer 296 through the barrier layer 293 to interact with the intermediate work-function metal layer 291 to form the work-function metal layer 299. In some embodiments, the work-function adjustment layer 296 is Al and the intermediate work-function metal layer 291 is TiAl. In some embodiments, the Al from the work-function adjustment layer 296 diffuses through the barrier layer 293 and interacts with the intermediate work-function metal layer 291 thereby forming a TiAl$_3$ work-function metal layer 299.

Figure 11:
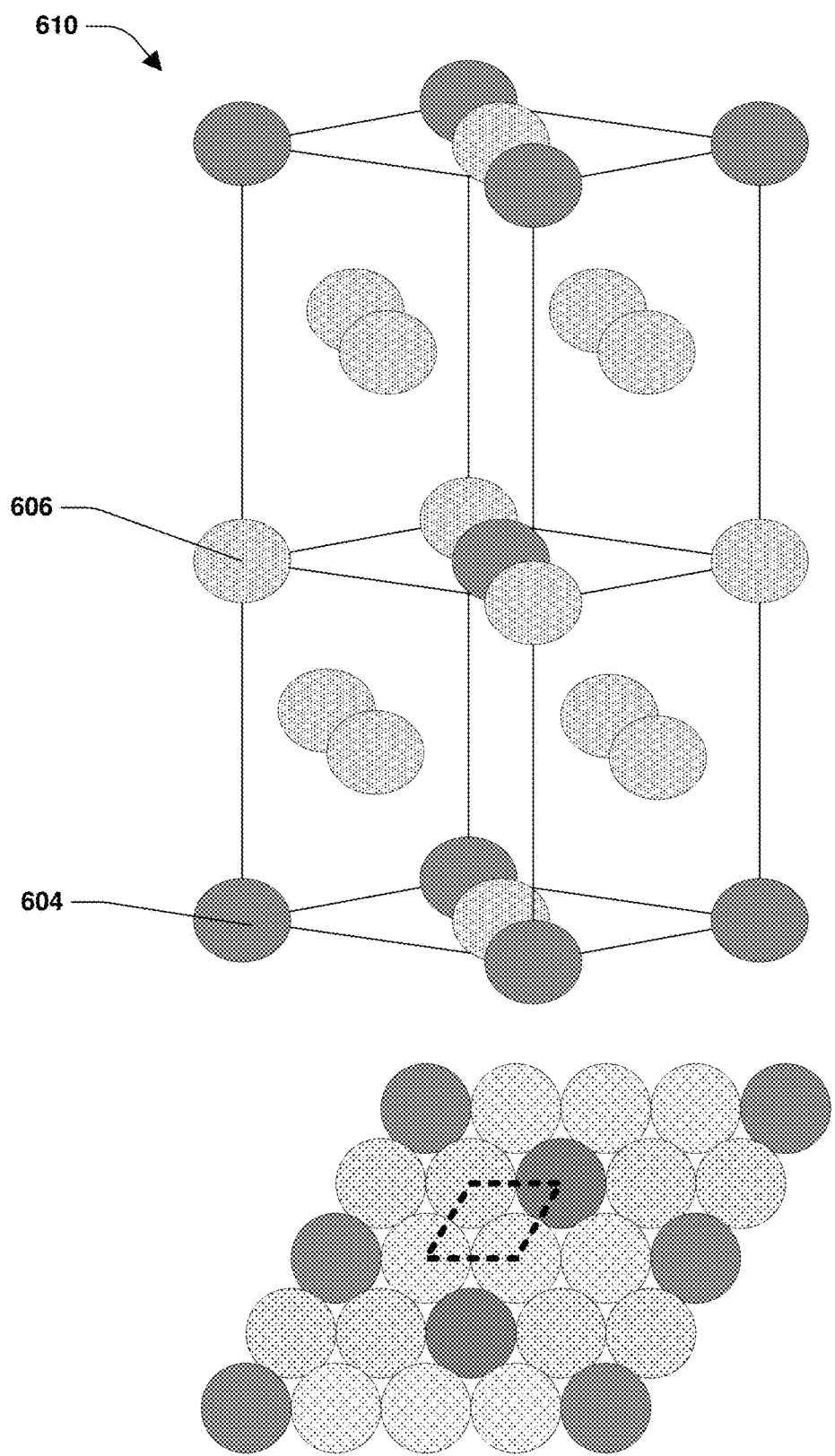
FIG. 11 is an illustration of a crystal structure of a work-function metal, according to some embodiments.

In some embodiments, the work-function metal layer 299 contains a crystalline metal. In some embodiments, the work-function metal layer 299 is crystalline TiAl$_3$. In some embodiments, the work-function metal layer 299 includes at least one of crystalline TiAl or crystalline TiAl$_3$. In some embodiments, the work-function metal layer 299 has a crystalline XRD profile. In some embodiments, the work-function metal layer 299 contains a crystalline work-function metal that has a D0$_{22}$ crystal structure 610, as show in FIG. 11.

Figure 12:
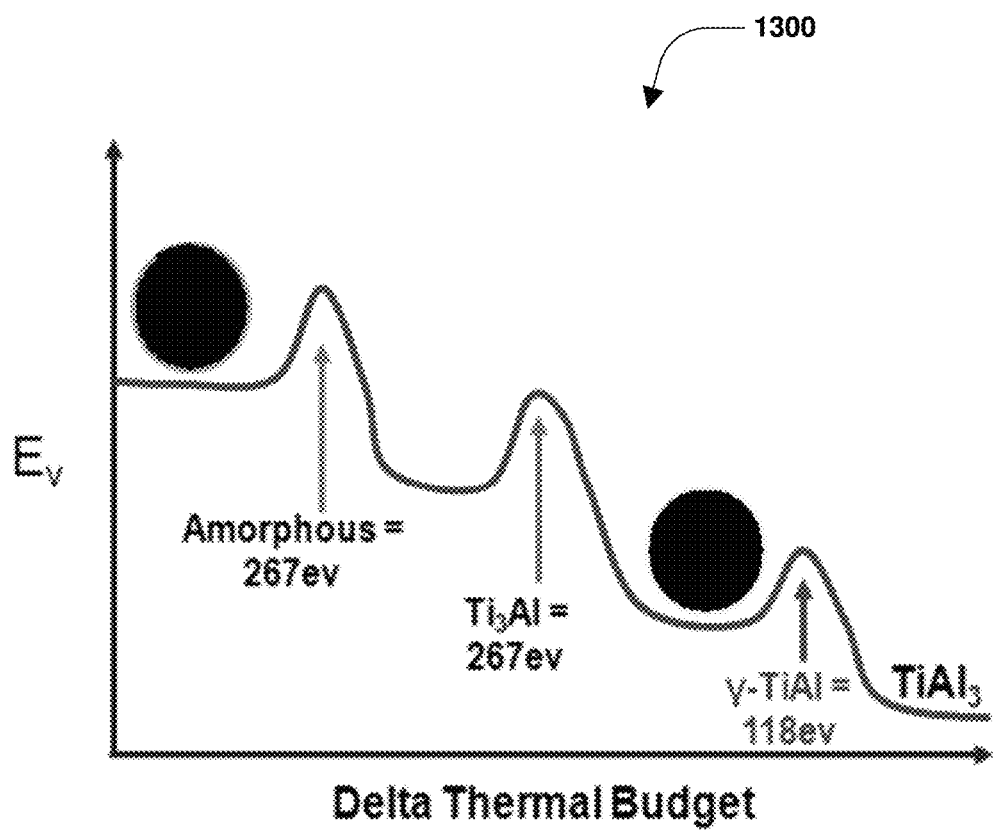
FIG. 12 is a graphical illustration of an interdiffusion energy barrier, according to some embodiments.

In some embodiments, crystallized TiAl and TiAl$_3$ are characterized as having a lower interdiffusion energy barrier than amorphous TiAl and Ti$_3$Al. FIG. 12 is a graph 1200 illustrating that a Ti—Al interdiffusion energy barrier for amorphous TiAl is 267 ev as compared to an interdiffusion energy barrier for crystalline TiAl which is 118 ev.

In some embodiments, the work-function metal layer 299 is greater than 10 angstroms thick. In some embodiments, the work-function metal layer 299 is between about 20 to about 100 angstroms thick. In some embodiments, the work-function metal layer 299 is thicker at the bottom of the opening than at the sides of the opening. In some embodiments, the work-function metal layer 299 is at least 1.5 times thicker at the bottom of the opening than it is at the sides of the opening.

Figure 13:
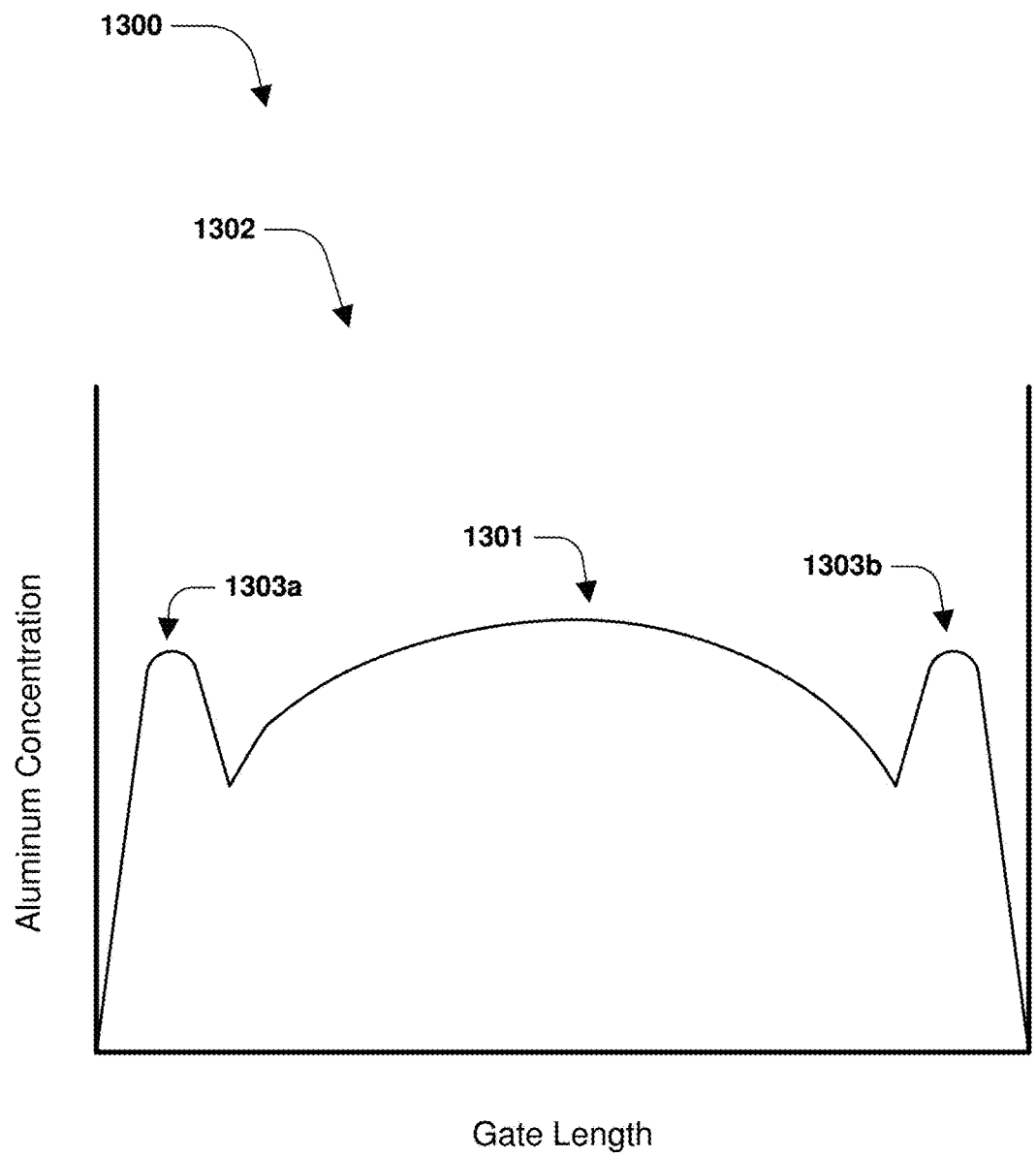
FIG. 13 is a graphical illustration of a profile in a work-function metal gate electrode, according to some embodiments.

In some embodiments, the work-function metal layer 299 has an ordered grain orientation. In some embodiments, the work-function metal layer 299 has an ordered metal grain orientation that provides a uniform threshold voltage and drain current. In some embodiments, the work-function metal layer 299 has a concave or convex profile 1302, as illustrated in graph 1300 FIG. 13. In some embodiments, the work-function metal layer 299 has an increased Al concentration at the center 1301 and edges 1303a and 1303b as illustrated in graph 1300 due to the diffusion of Al from the work-function adjustment layer 296 through the bottom and sidewalls of the barrier layer 293. In some embodiments, the increased Al concentration is due in part to the formation of TiAl$_3$. In some embodiments, the concave or convex profile lowers a resistance between source and drain extensions of the semiconductor device 200.

According to aspects of the instant disclosure, a semiconductor structure is provided. The semiconductor structure comprises a metal gate structure formed in an opening of an insulating layer. The metal gate structure comprises a gate dielectric layer, a barrier layer, a work-function metal layer between the gate dielectric layer and the barrier layer and a work-function adjustment layer over the barrier layer. The work-function metal having an ordered grain orientation.

According to aspects of the instant disclosure, a semiconductor structure is provided. The semiconductor structure comprises a metal gate structure formed in an opening in an insulating layer. The metal gate structure comprises a high-k gate dielectric layer, a barrier layer, a work-function metal layer between the high-k gate dielectric layer and the barrier layer, a capping layer between the high-k gate dielectric layer and the work-function metal layer and a work-function adjustment layer over the barrier layer. The work-function metal having an ordered grain orientation.

According to aspects of the instant disclosure, a method of fabricating a semiconductor device is provided. The method comprises forming a high-k gate dielectric layer in a first opening of an insulating layer. An intermediate work-function metal layer is formed over the high-k gate dielectric layer at temperature greater than about 200° C. A barrier layer is formed over the intermediate work-function metal layer. A work-function adjustment layer is formed over the barrier layer and a post thermal anneal is preformed to convert the intermediate work-function metal layer to a work-function metal layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of fabricating a semiconductor device, comprising:
   forming a gate dielectric layer in a first opening of an insulating layer;
   forming an intermediate work-function metal layer over the gate dielectric layer, wherein the intermediate work-function metal layer comprises at least one of titanium aluminide, nickel aluminide, or iron aluminide;
   forming a barrier layer over the intermediate work-function metal layer;
   forming a work-function adjustment layer over the barrier layer to completely fill an area defined by an interior perimeter of the barrier layer, wherein the work-function adjustment layer comprises aluminum; and
   performing a post thermal anneal after the forming a work-function adjustment layer to convert the intermediate work-function metal layer to a work-function metal layer, wherein the post thermal anneal drives elements of the work-function adjustment layer into the intermediate work-function metal layer.

2. The method of claim 1, comprising:
   forming a dummy gate structure over a substrate;
   forming an insulating layer around the dummy gate structure; and
   removing the dummy gate structure to create the first opening.

3. The method of claim 2, wherein:
   the dummy gate structure comprises a dielectric layer and a polysilicon layer, and
   the removing the dummy gate structure comprises removing both the dielectric layer and the polysilicon layer.

4. The method of claim 1, comprising:
   forming a capping layer over the gate dielectric layer prior to the forming an intermediate work-function metal layer.

5. The method of claim 4, wherein the capping layer comprises at least one of titanium nitride or tantalum nitride.

6. The method of claim 4, comprising:
   annealing the gate dielectric layer prior to the forming a capping layer.

7. The method of claim 1, wherein the forming an intermediate work-function metal layer comprises forming the intermediate work-function metal layer at a temperature greater than about 200° C.

8. The method of claim 1, comprising converting the intermediate work-function metal layer from an amorphous structure to a crystalline structure.

9. The method of claim 1, wherein the barrier layer comprises at least one of titanium nitride, tungsten nitride, tantalum nitride, or ruthenium.

10. The method of claim 1, wherein the performing a post thermal anneal comprises performing the post thermal anneal at a temperature between 300 to 600° C.

11. The method of claim 1, wherein:
   the intermediate work-function metal layer is TiAl,
   the work-function adjustment layer is Al, and
   the work-function metal layer is $TiAl_3$.

12. The method of claim 1, wherein the work-function metal layer is crystallized.

13. A method of fabricating a semiconductor device, comprising:
- defining an opening between a first sidewall of an insulating layer and a second sidewall of the insulating layer;
- forming an intermediate work-function metal layer in the opening, wherein the intermediate work-function metal layer is TiAl;
- forming a barrier layer in the opening and over the intermediate work-function metal layer;
- forming a work-function adjustment layer in the opening and over the barrier layer; and
- performing a post thermal anneal after the forming a work-function adjustment layer, wherein the post thermal anneal drives elements of the work-function adjustment layer into the intermediate work-function metal layer to convert the intermediate work-function metal layer to a work-function metal layer and the work-function metal layer is $TiAl_3$.

14. The method of claim 13, comprising converting the intermediate work-function metal layer from an amorphous structure to a crystalline structure.

15. The method of claim 13, wherein the work-function adjustment layer completely fills an area defined by an interior perimeter of the barrier layer.

16. A method of fabricating a semiconductor device, comprising:
- forming a gate dielectric layer in a first opening of an insulating layer;
- forming an intermediate work-function metal layer over the gate dielectric layer, wherein the intermediate work-function metal layer is TiAl;
- forming a barrier layer over the intermediate work-function metal layer;
- forming a work-function adjustment layer over the barrier layer to completely fill an area defined by an interior perimeter of the barrier layer, wherein the work-function adjustment layer is Al; and
- performing a post thermal anneal after the forming a work-function adjustment layer to convert the intermediate work-function metal layer to a work-function metal layer, wherein the post thermal anneal drives elements of the work-function adjustment layer into the intermediate work-function metal layer and the work-function metal layer is $TiAl_3$.

17. The method of claim 16, wherein the performing a post thermal anneal comprises performing the post thermal anneal at a temperature between 300 to 600° C.

18. The method of claim 16, wherein the barrier layer comprises at least one of titanium nitride, tungsten nitride, tantalum nitride, or ruthenium.

19. The method of claim 16, comprising:
- annealing the gate dielectric layer; and
- forming a capping layer over the gate dielectric layer after the annealing and prior to the forming an intermediate work-function metal layer.

20. The method of claim 16, wherein the work-function metal layer is crystallized.

* * * * *